(12) United States Patent
Ikeji et al.

(10) Patent No.: US 8,754,575 B2
(45) Date of Patent: Jun. 17, 2014

(54) PIEZOELECTRIC ELEMENT FITTING STRUCTURE AND HEAD SUSPENSION

(75) Inventors: Yoichi Ikeji, Aikoh-gun (JP); Hiroshi Ono, Aikoh-gun (JP)

(73) Assignee: NHK Spring Co., Ltd., Kanagawa (JP)

(*) Notice: Subject to any disclaimer, the term of this patent is extended or adjusted under 35 U.S.C. 154(b) by 456 days.

(21) Appl. No.: 13/235,951

(22) Filed: Sep. 19, 2011

(65) Prior Publication Data
US 2012/0091857 A1 Apr. 19, 2012

(30) Foreign Application Priority Data
Oct. 14, 2010 (JP) .................................. 2010-231851

(51) Int. Cl.
*H01L 41/053* (2006.01)

(52) U.S. Cl.
USPC ............................................................ 310/348

(58) Field of Classification Search
USPC ........................................................ 310/348
See application file for complete search history.

(56) References Cited

U.S. PATENT DOCUMENTS
2002/0195476 A1* 12/2002 Baba et al. ..................... 228/2.1

FOREIGN PATENT DOCUMENTS
JP 2002-184140 6/2002

* cited by examiner

*Primary Examiner* — Thomas Dougherty
(74) *Attorney, Agent, or Firm* — Jordan and Hamburg LLP

(57) ABSTRACT

A fitting structure for fitting a piezoelectric element to an actuator base that includes an opening that formed in the actuator base and accommodates the piezoelectric element, a receiver that inwardly protrudes from an inner circumferential edge of the opening and receives the piezoelectric element, a hole defined by an inner end of the receiver and communicates with the opening, a protrusion that protrudes from the inner end of the receiver onto the hole and faces the piezoelectric element through the hole, an adhesive part filled in a space defined by the piezoelectric element, the inner circumferential edge, and the receiver and is solidified in the space to adhere the piezoelectric element to the inner circumferential edge and the receiver, and a stopper formed on one of the receiver and protrusion and stops a capillary phenomenon of the adhesive between the piezoelectric element and the receiver and protrusion.

8 Claims, 7 Drawing Sheets

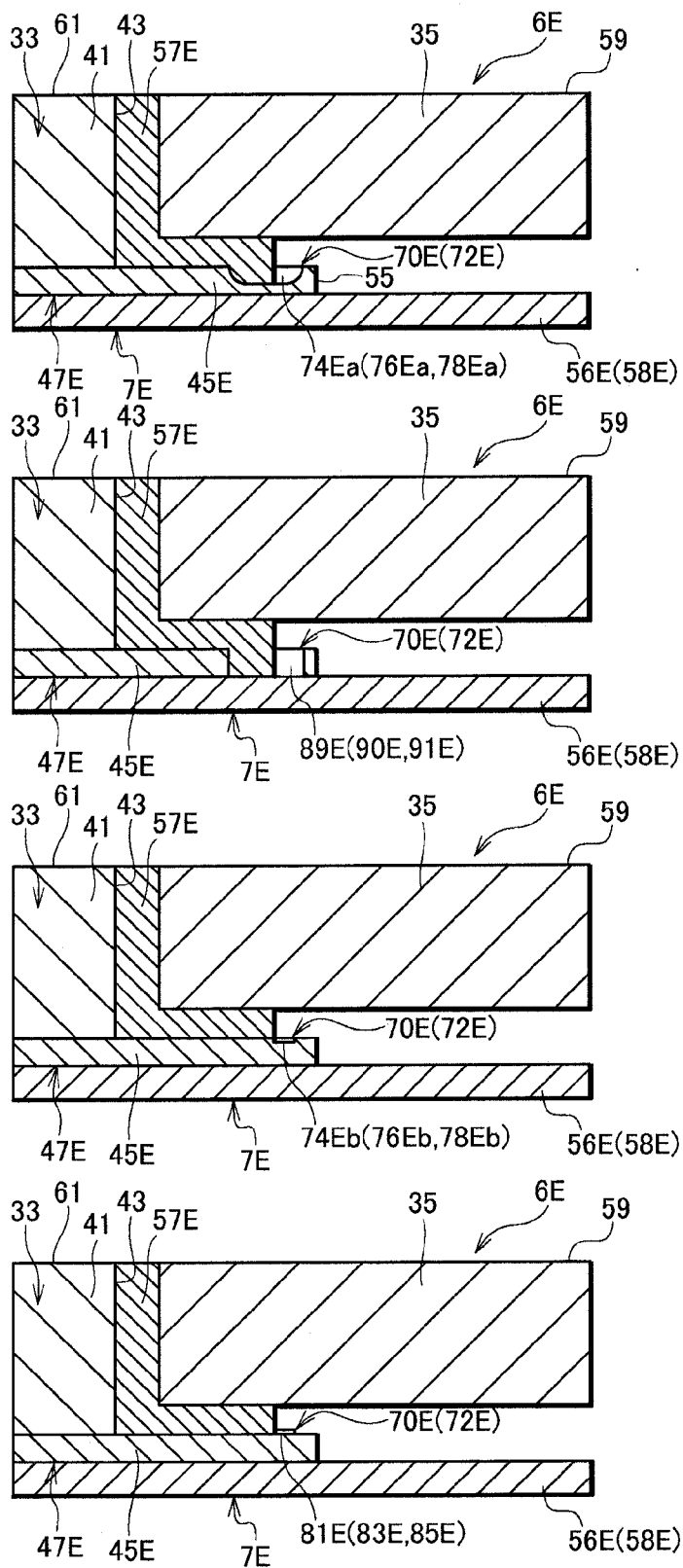

PIEZOELECTRIC ELEMENT FITTING STRUCTURE AND HEAD SUSPENSION

BACKGROUND OF THE INVENTION

1. Field of the Invention

The present invention relates to a structure for fitting a piezoelectric element to an object and a head suspension provided with such a structure, the piezoelectric element deforming in response to a voltage applied thereto and thereby moving an object.

2. Description of Related Art

Small-sized, precision information devices are rapidly advancing, and for use with such devices, needs for micro-actuators capable of conducting positioning control for very small distances are increasing. Such micro-actuators are highly needed by, for example, optical systems for correcting focuses and inclination angles, ink-jet printers for controlling ink heads, and magnetic disk drives for controlling magnetic heads.

The magnetic disk drives increase storage capacity by increasing the number of tracks per inch (TPI), i.e., by narrowing the width of each track on a magnetic disk.

Large-capacity magnetic disk drives, therefore, need an actuator capable of precisely positioning the magnetic head within a minute range across tracks.

To meet the need, Japanese Unexamined Patent Application Publication No. 2002-184140 discloses a head suspension with a dual actuator system. The dual actuator system employs a piezoelectric element in addition to a usual voice coil motor that drives a carriage to which the head suspension is attached. The piezoelectric element is arranged between a base plate and a load beam of the head suspension, to minutely move a magnetic head attached to a front end of the load beam.

According to this related art, the voice coil motor turns the head suspension through the carriage, and in addition, the piezoelectric element deforms in proportion to a voltage applied thereto, to minutely move the magnetic head at the front end of the load beam in a sway direction (a widthwise direction of the load beam) relative to the base plate. The dual actuator system involving the voice coil motor and piezoelectric element is capable of precisely positioning the magnetic head to a target position on a magnetic disk.

The head suspension with the dual actuator system employs a structure for fitting the piezoelectric element to an actuator base of the head suspension.

The actuator base has an opening to accommodate the piezoelectric element and a receiver that protrudes inwardly from an inner circumferential edge of the opening to support the periphery of the piezoelectric element.

When the piezoelectric element is set in the opening of the actuator base, a liquid adhesive is applied and solidified between the piezoelectric element and the receiver and inner circumferential edge of the opening, thereby attaching the piezoelectric element to the actuator base. To surely fix the piezoelectric element to the actuator base, the liquid adhesive is applied so that it slightly swells out of the receiver into a hole defined by an inner end of the receiver.

With this, the piezoelectric element is surely bonded to the actuator base, to secure electric insulation between them and effectively transfer deformation (driving force) of the piezoelectric element through the actuator base to the load beam.

To deform the piezoelectric element attached in that way, a voltage is applied through a flexure (wiring member) that is arranged on the actuator base.

According to the related art, a part of the flexure protrudes from the inner end of the receiver to the hole defined by the inner end of the receiver and faces the piezoelectric element through the hole. The protruding part of the flexure may come in contact with the swelled part of the liquid adhesive.

If this happens, the swelled part of the liquid adhesive is drawn from the receiver into the hole due to a capillary phenomenon of the liquid adhesive between the flexure and the piezoelectric element.

Generally, the liquid adhesive is continuously applied in a given quantity to the receiver and inner circumferential edge of the opening. If the liquid adhesive is drawn into the hole due to the capillary phenomenon, the adhesive left between the piezoelectric element and the receiver and inner circumferential edge of the opening will be insufficient and will deteriorate bonding strength between the piezoelectric element and the actuator base.

This results in incorrectly transferring deformation (driving force) of the piezoelectric element to the actuator base and unexpectedly increasing the rigidity of the hole to worsen the dynamic characteristics of the head suspension.

SUMMARY OF THE INVENTION

An object of the present invention is to provide a structure for fitting a piezoelectric element to an actuator base of a head suspension, capable of preventing a liquid adhesive from oozing out of a receiver that supports the piezoelectric element due to a capillary phenomenon of the liquid adhesive caused between the piezoelectric element and a wiring member.

In order to accomplish the object, an aspect of the present invention provides a fitting structure for fitting a piezoelectric element to an actuator base, the actuator base on which a wiring member is arranged to apply a voltage to the piezoelectric element, the piezoelectric element deforming according to the applied voltage and thereby displacing a supported object to the actuator base. The fitting structure includes an opening formed in the actuator base to accommodate the piezoelectric element, a receiver inwardly protruding from an inner circumferential edge of the opening to receive the piezoelectric element, a hole defined by an inner end of the receiver and communicating with the opening, a protrusion being a part of the wiring member and protruding from the inner end of the receiver onto the hole to face the piezoelectric element through the hole, an adhesive part formed of a liquid adhesive that is continuously filled in a space defined by the piezoelectric element, the inner circumferential edge of the opening, and the receiver and is solidified in the space to adhere the piezoelectric element to the inner circumferential edge of the opening and the receiver, and a stopper formed on one of the receiver and protrusion and stopping a capillary phenomenon of the liquid adhesive between the piezoelectric element and said one of the receiver and protrusion.

This aspect of the present invention stops, at the stopper, a capillary phenomenon of the liquid adhesive between the piezoelectric element and the receiver or the wiring member. This results in preventing the liquid adhesive from oozing out of the receiver due to the capillary phenomenon caused between the piezoelectric element and the wiring member.

BRIEF DESCRIPTION OF THE DRAWINGS

FIGS. 13A to 13D are sectional views taken along a line XIII-XIII of FIG. 12, illustrating various examples of the sixth embodiment.

DETAILED DESCRIPTION OF EMBODIMENTS

Embodiments of the present invention will be explained in detail with reference to the drawings. Each embodiment forms a stopper on a receiver or a wiring member of an actuator base to which a piezoelectric element is attached. The stopper stops a capillary phenomenon of a liquid adhesive between the piezoelectric element and the receiver or the wiring member, thereby preventing the liquid adhesive from oozing out of the receiver.

Figure 1:
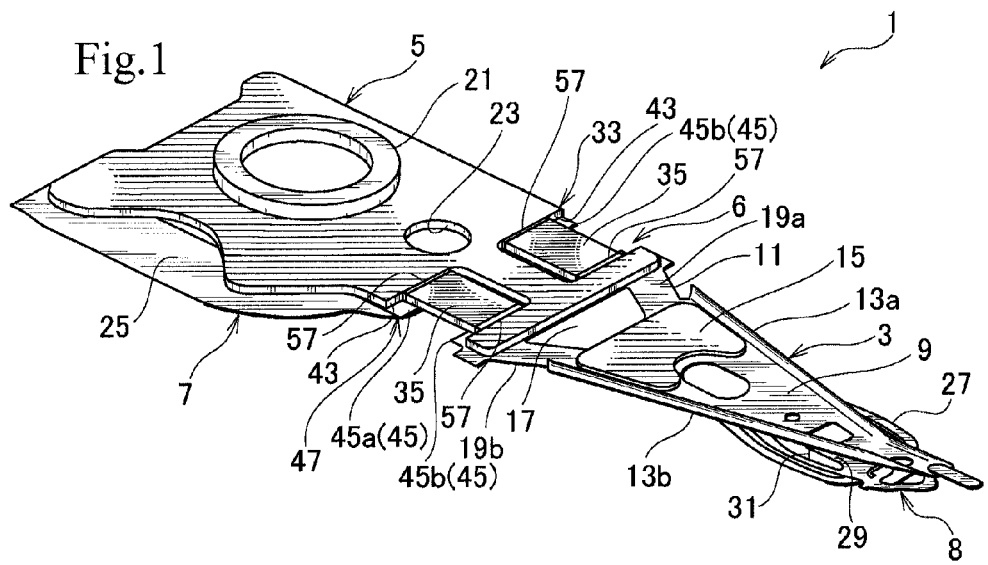
FIG. 1 is a perspective view illustrating a head suspension having a piezoelectric actuator to which a piezoelectric element fitting structure according to a first embodiment of the present invention is applied.
Figure 2:
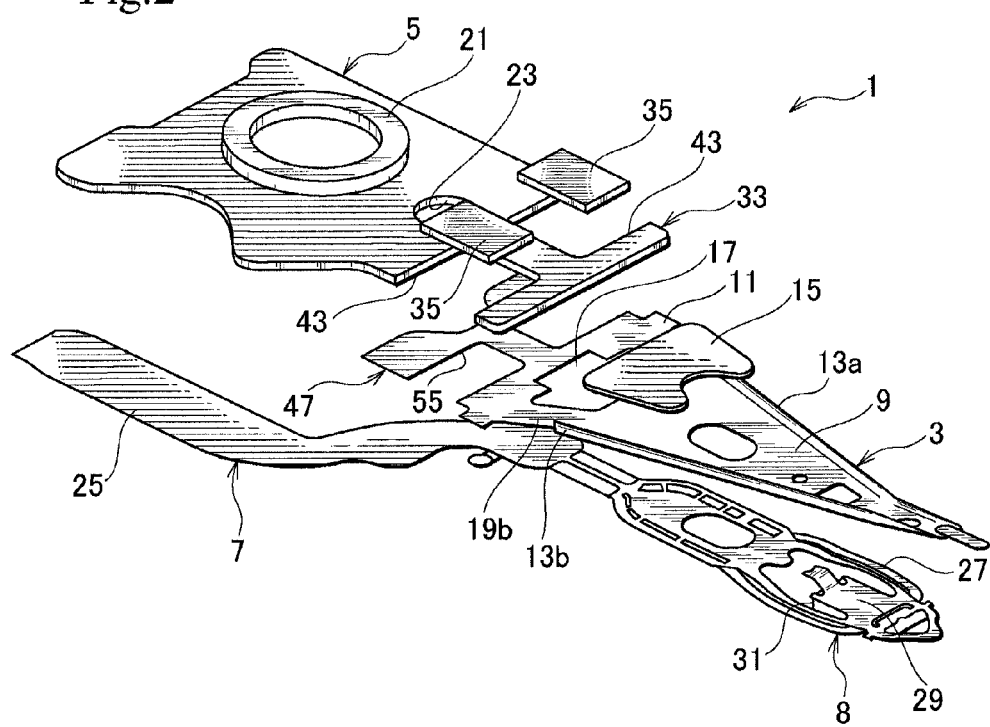
FIG. 2 is an exploded perspective view illustrating the head suspension of FIG. 1.

FIG. 1 is a perspective view illustrating a head suspension 1 having a piezoelectric actuator 6 to which a piezoelectric element fitting structure and FIG. 2 is an exploded perspective view illustrating the same.

As illustrated in FIGS. 1 and 2, the head suspension 1 has a load beam 3 as a supported object, a base plate 5 as a base of the head suspension 1, the piezoelectric actuator 6, and a flexure 7 as a wiring member.

The load beam 3 applies load onto a read/write head 8 and includes a rigid part 9 and a resilient part 11. The rigid part 9 is made of a resilient metal thin plate such as resilient stainless steel thin plate having a thickness in the range of about 30 to 150 μm.

Along each edge of the rigid part 9, bends 13a and 13b rise and extend from a front end to a base end of the rigid part 9, to improve the rigidity of the rigid part 9. The base end of the rigid part 9 is provided with a damper 15 and is integral with the resilient part 11.

The resilient part 11 has a through window 17 and legs 19a and 19b formed on each side of the window 17. The resilient part 11 may separately be formed from the rigid part 9 and may be fixed to the rigid part 9 by, for example, laser welding.

The base plate 5 supports the head 8 through the load beam 3. The base plate 5 is made of a metal thin plate such as stainless steel thin plate having a thickness in the range of about 150 to 200 μm.

The base plate 5 has a circular boss 21. With the boss 21, the base plate 5 is attached to a carriage (not illustrated) that is turned by a voice coil motor (not illustrated). The base plate 5 may have a reinforcing plate that is laid on and fixed to the base plate 5.

A front end of the base plate 5 has a cut 23 and supports the load beam 3 through the piezoelectric actuator 6. The details of the piezoelectric actuator 6 will be explained later.

The flexure 7 includes a conductive substrate 25 made of, for example, a resilient stainless steel thin rolled plate (SST), an insulating layer formed on the substrate 25, and wiring 27 formed on the insulating layer. The substrate 25 has a thickness in the range of about 10 to 25 μm.

The flexure 7 extends from the base plate 5 side, passes over the piezoelectric actuator 6, and reaches a front end of the load beam 3. Namely, the flexure 7 is arranged on an actuator base 33 of the piezoelectric actuator 6. The flexure 7 is fixed to the load beam 3 by, for example, laser welding.

The flexure 7 has a tongue 29 in the form of a cantilever. The tongue 29 supports a slider 31 of the head 8 to which an end of the wiring 27 is electrically connected.

Figure 3:
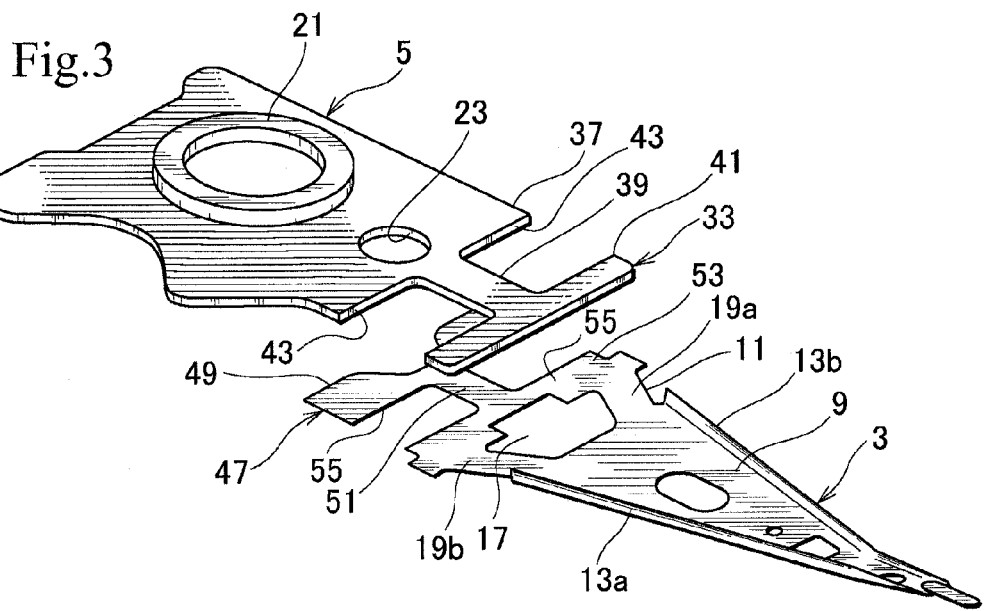
FIG. 3 is an exploded view illustrating a base plate and load beam of the head suspension of FIG. 2.

The piezoelectric actuator 6 will be explained in detail. FIG. 3 is an exploded view illustrating the base plate 5 and load beam 3 of the head suspension 1, FIG. 4 is a partial plan view illustrating the piezoelectric actuator 6, FIG. 5 is a sectional view taken along a line V-V of FIG. 4, and FIG. 6 is a sectional view illustrating a stopper 70 (72) of FIG. 5.

The piezoelectric actuator 6 has the piezoelectric element fitting structure according to the first embodiment of the present invention. As illustrated in FIG. 1, the piezoelectric actuator 6 includes the actuator base 33 and a pair of piezoelectric elements 35. The piezoelectric actuator 6 is arranged between the base plate 5 and the load beam 3. When a voltage is applied from the wiring 27 of the flexure 7 to the piezoelectric elements 35, the piezoelectric elements 35 deform to displace the load beam 3, thereby minutely move the head 8 relative to the base plate 5 in a sway direction with the piezoelectric actuator 6 (a width direction of the load beam 3).

Figure 4:
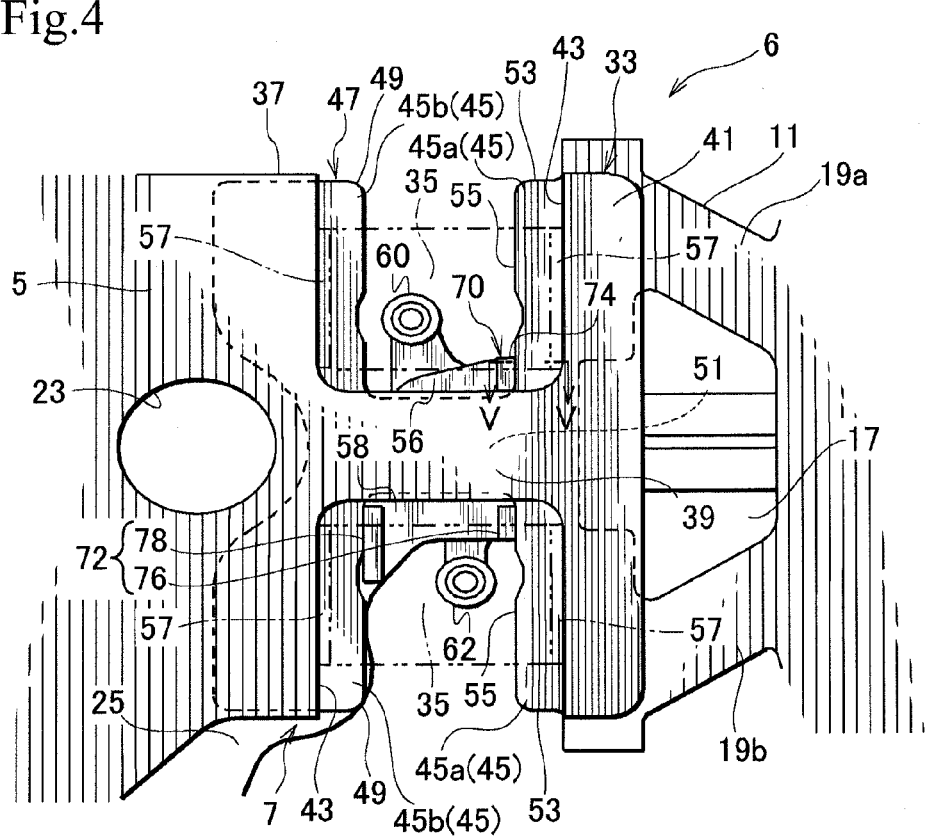
FIG. 4 is a partial plan view illustrating a piezoelectric actuator of FIG. 1.
Figure 5:
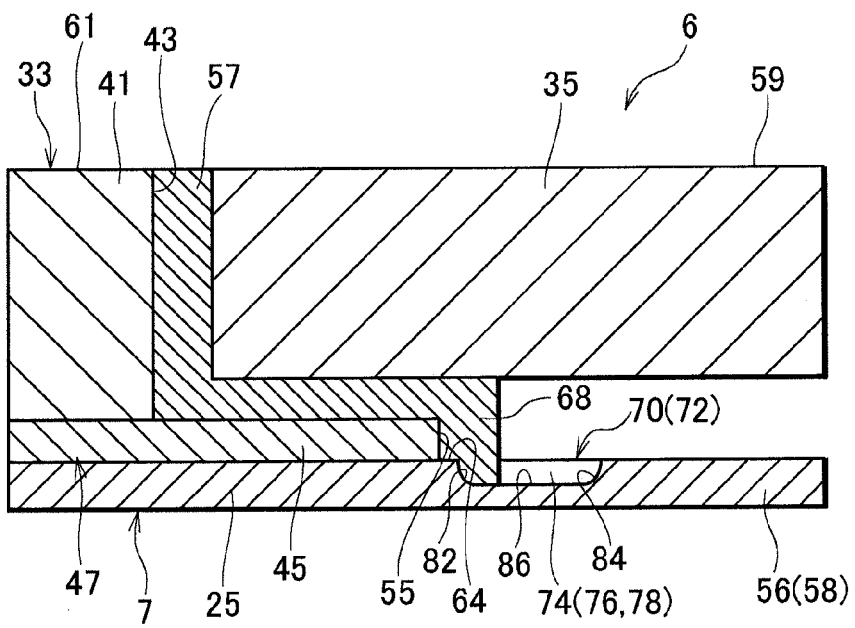
FIG. 5 is a sectional view taken along a line V-V of FIG. 4.
Figure 6:
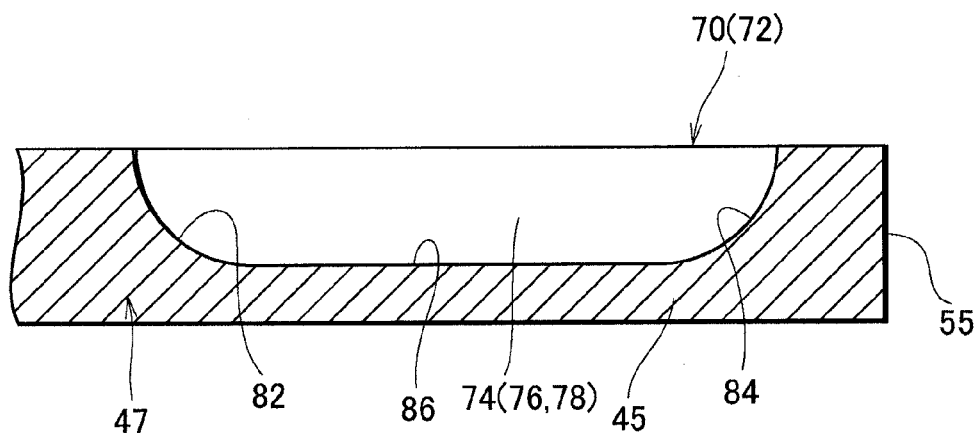
FIG. 6 is a sectional view illustrating a stopper of FIG. 5.

As illustrated in FIGS. 3-5, the actuator base 33 is integral with a front end of the base plate 5. The actuator base 33 may separately be formed from the base plate 5 and may be fixed to the base plate 5 by, for example, laser welding.

The actuator base 33 includes a base rear 37, a base middle 39, and a base front 41. The base rear 37 is integral with the base plate 5. The base middle 39 is at the center of the width of the actuator base 33 and extends in a longitudinal direction of the load beam 3. The base middle 39 integrally connects the base rear 37 to the base front 41. The base front 41 extends in a width-wise direction of the piezoelectric actuator 6 so as to face the base rear 37.

On each side of the base middle 39, openings 43 are formed. Each opening 43 has a rectangular shape, is formed through the actuator base 33, is open to a side of the actuator base 33, and is provided with a receiver 45.

The receiver 45 inwardly protrudes from the base rear 37 and base front 41 that define an inner circumferential edge of the opening 43, to receive the periphery of the piezoelectric element 35. The receiver 45 is made of a receiver member or receiver plate 47 that is prepared or formed separately from the actuator base 33. The receiver 45 may be integral with the actuator base 33. In this case, the receiver 45 may be formed by partially etching the actuator base 33.

The receiver plate 47 is integral with a base end of the load beam 3, i.e., a base end of the resilient part 11. The receiver plate 47 may be formed separately from the resilient part 11 and may be fixed to the resilient part 11 by, for example, laser welding.

The receiver plate 47 is laid on the actuator base 33 and is fixed thereto at proper locations by, for example, laser welding. With the receiver plate 47 fixed to the actuator base 33, the load beam 3 is supported by the base plate 5 through the piezoelectric actuator 6. Opposite to the actuator base 33, the conductive substrate 25 of the flexure 7 is laid on the receiver plate 47.

The shape of the receiver plate 47 corresponds to the shape of the actuator base 33. The receiver plate 47 has a plate rear 49 corresponding to the base rear 37, a plate middle 51 corresponding to the base middle 39, a plate front 53 corresponding to the base front 41, and holes 55 corresponding to the openings 43.

Each hole 55 is shorter in the longitudinal direction than the opening 43. Along each opposing side of the hole 55 of the receiver plate 47, a part of the plate rear 49 and a part of the plate front 53 face the opening 43, to provide the opening 43 with the receiver 45. An inner end of the receiver 45 defines the hole 55.

The plate middle 51 is narrower than the base middle 39 of the actuator base 33, and therefore, is completely covered by the base middle 39.

Into the holes 55, a part of the flexure 7 protrudes as flexure protrusions 56 and 58 from an inner end of the receiver 45. The one flexure protrusion 56 extends from a front receiver 45a of the receiver 45, passes over the hole 55, and reaches the plate middle 51. The other flexure protrusion 58 extends over the hole 55 to bridge the front receiver 45a and a rear receiver 45b of the receiver 45. The flexure protrusion 56 is at a base part of a terminal 60 of the flexure 7 and the flexure protrusion 58 is at a base part of a terminal 62 of the flexure 7.

The terminal 60 (62) extends from the flexure protrusion 56 (58) onto the hole 55 and has a circular end. At the circular end of the terminal 60 (62), the conductive substrate 25 and insulating layer are removed to partly expose the wiring 27. The exposed wiring 27 at the terminal 60 (62) is electrically connected to the piezoelectric element 35 with a bonding wire, a conductive adhesive, or the like.

Each piezoelectric element 35 is received in and attached to the opening 43 of the actuator base 33 with an adhesive part 57.

The piezoelectric element 35 is made of piezoelectric ceramics such as PZT (lead zirconate titanate) to deform in response to a voltage applied thereto. The piezoelectric element 35 has a rectangular shape that is slightly smaller than the shape of the opening 43 of the actuator base 33.

A first face 59 of the piezoelectric element 35 is substantially flush with a first face 61 of the actuator base 33 and is electrically connected to the first face 61 with, for example, conductive resin.

A second face 63 of the piezoelectric element 35 is opposite to the first face 59. The second face 63 includes a periphery facing the receiver 45 and is received thereby. A part of the second face 63 except the periphery thereof faces the flexure protrusion 56 (58) and terminal 60 (62) of the flexure 7 through the hole 55.

In this facing area, the second face 63 of the piezoelectric element 35 is electrically connected to the terminal 60 (62) of the flexure 7, so that the piezoelectric element 35 may receive voltage through the flexure 7.

As illustrated in FIGS. 1, 4 and 5, the adhesive part 57 is made of a nonconductive liquid adhesive that is continuously filled and solidified in a space between the piezoelectric element 35 and the inner circumferential edge of the opening 43, i.e., spaces between the piezoelectric element 35 and the base front 41 and base rear 37, as well as a space between the piezoelectric element 35 and the receiver 45.

The adhesive part 57 buries the spaces between the piezoelectric element 35 and the inner circumferential edge of the opening 43 and the receiver 45, to fix the piezoelectric element 35 to the actuator base 33 and secure insulation and deformation (driving force) transfer between the piezoelectric element 35 and the actuator base 33.

According to the first embodiment, the liquid adhesive for the adhesive part 57 is filled so that it protrudes from an inner end of the receiver 45 into the hole 55, to surely fix the piezoelectric element 35 to the actuator base 33. When hardened, the liquid adhesive forms an adhesive protrusion 68 of the adhesive part 57. The adhesive protrusion 68 is formed along the inner end of the receiver 45 and is positioned between the piezoelectric element 35 and the flexure protrusion 56 (58).

The liquid adhesive may be a known nonconductive liquid adhesive. According to the first embodiment, the liquid adhesive is a base liquid adhesive containing hardening particles. The base liquid adhesive and hardening particles react when heated and solidify.

In the piezoelectric actuator 6, the flexure protrusion 56 (58) of the flexure 7 is provided with the stopper 70 (72) as illustrated in FIGS. 4-6.

The stopper 70 (72) is formed on the flexure protrusion 56 (58) adjacent to the receiver 45. More precisely, the stopper 70 has a recess 74 adjacent to the front receiver 45a and the stopper 72 has a recess 76 adjacent to the front receiver 45a and a recess 78 adjacent to the rear receiver 45b.

The recesses 74, 76, and 78 each have a rectangular shape extending in the width direction of the load beam 3. The recesses 74, 76, and 78 are each formed in the width direction at a location where the receiver 45, flexure protrusion 56 (58), and adhesive part 57 overlap one another in the longitudinal direction. According to the first embodiment, the recess 74 (76, 78) inwardly extends in the width direction along the overlapping area.

The recesses 74, 76, and 78 of the stoppers 70 and 72 have the same sectional shape, and therefore, only the recess 74 of the stopper 70 will be explained in detail.

The recess 74 of the stopper 70 is formed by partially removing the conductive substrate 25 of the flexure protrusion 56 with, for example, partial etching. In the sectional view of FIG. 6, the recess 74 extends from the receiver 45 side toward the middle of the hole 55. Between the recess 74 and the receiver 45, there is a slight gap to form a remnant 64 of the flexure protrusion 56 where the partially removing is not carried out.

Each side of the recess 74 has an arc face 82 (84) that gradually deepens toward the middle of the recess 74 and continues to a flat bottom 86.

The depth of the recess 74 is set so that no capillary phenomenon of the liquid adhesive occurs between the piezoelectric element 35 and the flexure protrusion 56. Namely, the stopper 70 is formed to stop the capillary phenomenon of the liquid adhesive caused between the piezoelectric element 35 and the flexure protrusion 56. The depth of the recess 74 is properly set in consideration of the viscosity, setting time, and the like of the liquid adhesive.

Assembling the piezoelectric actuator 6 will be explained. The actuator base 33 of the base plate 5 and the receiver plate 47 of the load beam 3 are laid one on another and are fixed to each other at predetermined positions. The flexure 7 having the stoppers 70 and 72 is fixed to the load beam 3.

As illustrated in FIGS. 4 and 5, a liquid adhesive is applied to the base front 41, base rear 37, and receiver 45 in each opening 43. The piezoelectric element 35 is set at a predetermined position in each opening 43. It is preferable that the liquid adhesive is mixed with nonconductive small fillers for positioning the piezoelectric elements 35.

At this time, the liquid adhesive is applied so that it slightly oozes from the inner end of the receiver 45 into the hole 55. The oozed part of the liquid adhesive comes in contact with the second face 63 of the piezoelectric element 35, and at the same time, flows along the inner end of the receiver 45 to the surface of the remnant 64 of the flexure protrusion 56 (58).

In this state, a capillary phenomenon between the piezoelectric element 35 and the remnant 64 is caused. Due to the capillary phenomenon, the oozed part of the liquid adhesive is going to inwardly move from the remnant 64 in the hole 55.

At this time, the recess 74 (76, 78) of the stopper 70 (72) in the hole 55 inwardly adjacent to the remnant 64 expands a space between the piezoelectric element 35 and the flexure protrusion 56 (58). As a result, the oozed part of the liquid adhesive flows from the remnant 64 into the recess 74 (76, 78) of the stopper 70 (72), thereby stopping the capillary phenomenon.

Consequently, the oozed part of the liquid adhesive is restricted from flowing from the recess 74 (76, 78) farther into the hole 55. The liquid adhesive, therefore, keeps a state of filling the space between the piezoelectric element 35 and the inner circumferential edge of the opening 43 and the space between the piezoelectric element 35 and the receiver 45.

Depending on an applied quantity, the liquid adhesive may not come in contact with the flexure protrusion 56 (58) of the flexure 7. This may cause no problem.

Thereafter, the head suspension 1 with the piezoelectric actuator 6 is heat-treated at a predetermined temperature for a predetermined time with the use of, for example, an electric furnace. Due to the heat treatment, the base liquid adhesive reacts with the hardening particles, to form the adhesive part 57 and adhesive protrusion 68.

With the adhesive part 57 and adhesive protrusion 68, the piezoelectric element 35 is fixed to the inner circumferential edge of the opening 43 and the receiver 45. This completes the assembling of the piezoelectric actuator 6.

As mentioned above, the piezoelectric element fitting structure according to the first embodiment includes the opening 43 that is formed in the actuator base 33 to accommodate the piezoelectric element 35, the receiver 45 inwardly protruding from the inner circumferential edge of the opening 43 to receive the piezoelectric element 35, the hole 55 defined by the inner end of the receiver 45 and communicating with the opening 43, the flexure protrusion 56 (58) being a part of the flexure 7 and protruding from the inner end of the receiver 45 onto the hole 55 to face the piezoelectric element 35 through the hole 55, the adhesive part 57 formed of a liquid adhesive that is continuously filled in a space defined by the piezoelectric element 35, the inner circumferential edge of the opening 43, and the receiver 45 and is solidified in the space to adhere the piezoelectric element 35 to the inner circumferential edge and receiver 45 of the opening 43, and the stopper 70 (72) formed on the flexure protrusion 56 (58) and stopping a capillary phenomenon of the liquid adhesive between the piezoelectric element 35 and the flexure protrusion 56 (58).

According to the first embodiment, the oozed part of the liquid adhesive from the receiver 45 may come in contact with the flexure protrusion 56 (58). Even if it happens, the stopper 70 (72) stops a capillary phenomenon of the oozed liquid adhesive between the piezoelectric element 35 and the flexure protrusion 56 (58).

The first embodiment, therefore, is capable of restricting the oozed part of the liquid adhesive from flowing into the inside of the hole 55 and preventing the liquid adhesive from excessively flowing out of the receiver 45.

With this, the first embodiment surely transfers deformation (driving force) of each piezoelectric element 35 to the load beam 3 and prevents an unexpected increase in rigidity from occurring inside the hole 55, thereby securing the dynamic characteristics of the head suspension 1.

The stopper 70 (72) is formed of the recess 74 (76, 78) that is formed by reducing the thickness of the flexure protrusion 56 (58). The stopper 70 (72) expands a gap between the piezoelectric element 35 and the flexure protrusion 56 (58), to easily and surely block the capillary phenomenon of the liquid adhesive.

The recess 74 (76, 78) serving as the stopper 70 is adjacent to the receiver 45 and the remnant 64 is left between the recess 74 (76, 78) and the receiver 45. Accordingly, the recess 74 (76, 78) effectively blocks the capillary phenomenon of the liquid adhesive occurring at the remnant 64.

The head suspension 1 employing the piezoelectric element fitting structure according to the first embodiment surely transfers deformation (driving force) of each piezoelectric element 35 to the load beam 3, causes no unexpected increase in rigidity at the hole 55, secures dynamic characteristics, and improves a positioning accuracy of the head 8.

Figure 7:
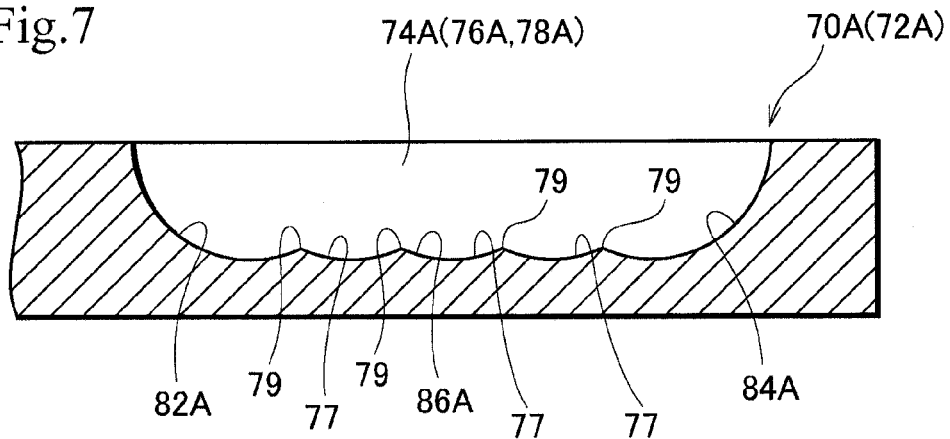
FIG. 7 is a sectional view illustrating a stopper of a piezoelectric actuator to which a piezoelectric element fitting structure according to a second embodiment of the present invention is applied.

A second embodiment of the present invention will be explained with reference to FIG. 7. FIG. 7 is a sectional view illustrating a stopper of a piezoelectric actuator to which a piezoelectric element fitting structure according to the second embodiment of the present invention is applied. The second embodiment is basically the same as the first embodiment, and therefore, corresponding parts are represented with the same reference marks, or the same reference marks plus "A" to omit a repetition of explanation.

The second embodiment differs from the first embodiment in that the second embodiment employs stoppers 70A and 72A formed of recesses 74A, 76A, and 78A that have different sectional shapes from the recesses 74, 76, and 78 of the first embodiment. According to the second embodiment, the recess 74A (76A, 78A) has a bottom face 86A that is concavo-convex or irregular as illustrated in FIG. 7. The bottom face 86A contains a plurality of concaves 77 that are consecutive. Between the adjacent concaves 77, there is a ridge 79.

The second embodiment provides effect similar to that provided by the first embodiment. In addition, the irregular bottom face 86A having the concaves 77 and ridges 79 surely suppresses the flow of a liquid adhesive.

The irregular bottom face 86A according to the second embodiment may be formed selectively on the recesses 74A, 76A, and 78A of the stoppers 70A and 72A. In this case, the remaining recesses are each provided with the flat bottom face 86 of the first embodiment.

Figure 8:
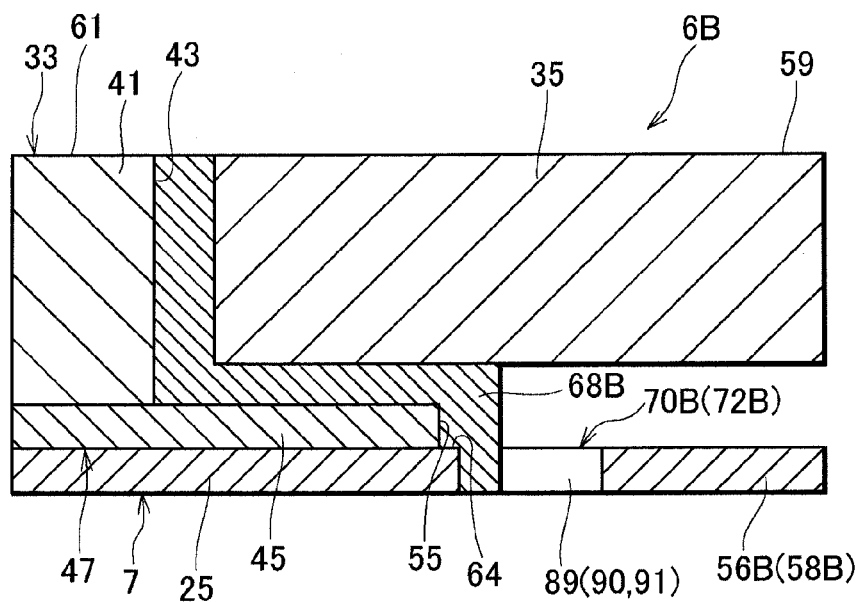
FIG. 8 is a sectional view partly illustrating a piezoelectric actuator to which a piezoelectric element fitting structure according to a third embodiment of the present invention is applied.

A third embodiment of the present invention will be explained with reference to FIG. 8. FIG. 8 is a sectional view partly illustrating a piezoelectric actuator to which a piezoelectric element fitting structure according to the third embodiment of the present invention is applied. The third embodiment is basically the same as the first embodiment, and therefore, corresponding parts are represented with the same reference marks, or the same reference marks plus "B" to omit a repetition of explanation.

The third embodiment employs through holes 89, 90, and 91 to form stoppers 70B and 72B instead of the recesses 74, 76, and 78 of the first embodiment. The through holes 89, 90, and 91 are formed through flexure protrusions 56B and 58B of a flexure 7.

The third embodiment provides effect similar to that provided by the first embodiment.

The through holes according to the third embodiment may be formed selectively on the stoppers. In this case, the remaining stopper is formed from a recess like the first embodiment.

Figure 9:
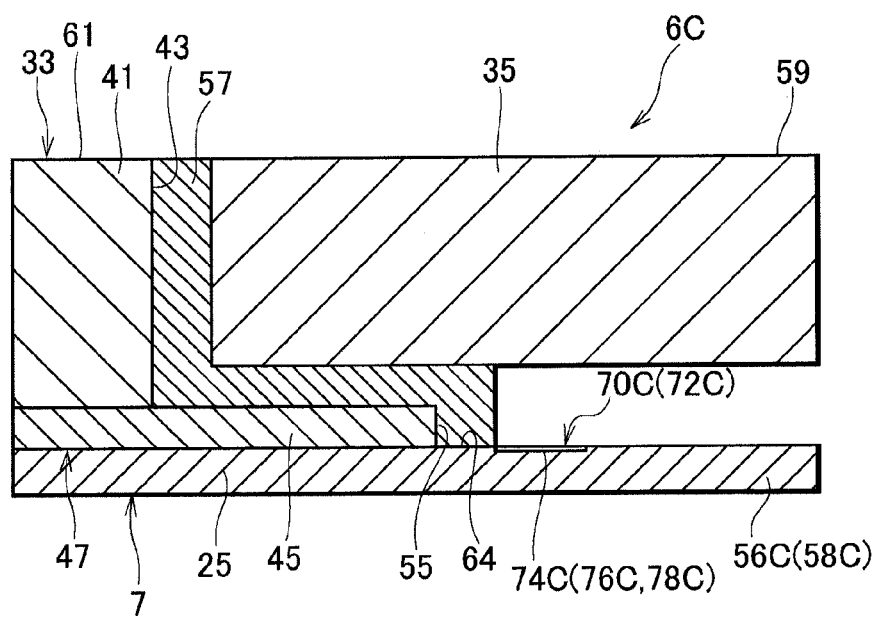
FIG. 9 is a sectional view partly illustrating a piezoelectric actuator to which a piezoelectric element fitting structure according to a fourth embodiment of the present invention is applied.
Figure 10:
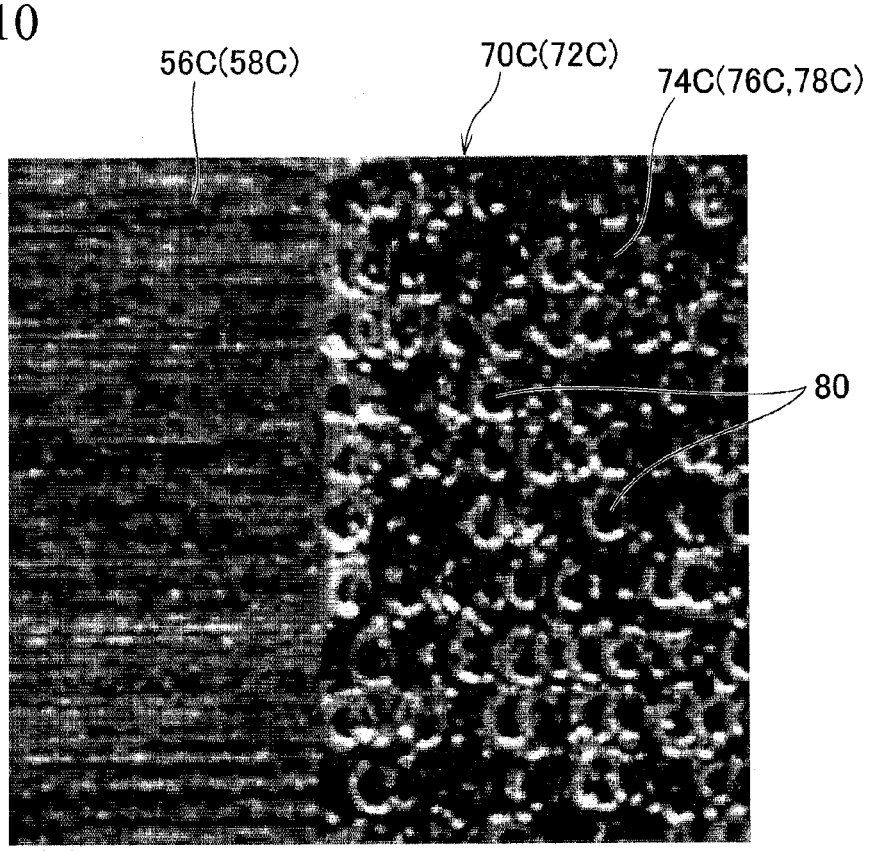
FIG. 10 is an enlarged view illustrating a stopper of FIG. 9.

A fourth embodiment of the present invention will be explained with reference to FIGS. 9 and 10. FIG. 9 is a sectional view partly illustrating a piezoelectric actuator to which a piezoelectric element fitting structure according to the fourth embodiment of the present invention is applied and FIG. 10 is an enlarged view illustrating a stopper of FIG. 9. The fourth embodiment is basically the same as the first embodiment, and therefore, corresponding parts are represented with the same reference marks, or the same reference marks plus "C" to omit a repetition of explanation.

Instead of the recesses 74, 76, and 78 of the stoppers 70 and 72 of the first embodiment, the fourth embodiment forms recesses 74C, 76C, and 78C by laser processing for stoppers 70C and 72C as illustrated in FIGS. 9 and 10.

The recesses 74C, 76C, and 78C according to the fourth embodiment are each an aggregation of very small recesses 80 formed by laser processing. Accordingly, the surfaces of the recesses 74C, 76C, and 78C are rougher than the surfaces of flexure protrusions 56C and 58C of a flexure 7.

The recesses 74C, 76C, and 78C of the stoppers 70C and 72C according to the fourth embodiment reduce the wettability of the flexure protrusions 56C and 58C.

According to the fourth embodiment, the stoppers 70C and 72C block a capillary phenomenon of liquid adhesive between piezoelectric elements 35 and the flexure protrusions 56C and 58C. Namely, the fourth embodiment provides effect similar to that provided by the first embodiment.

The recesses by laser processing of the fourth embodiment may be formed selectively on the stoppers 70C and 72C. In this case, the remaining stopper is formed of a recess or a through hole like the first and third embodiments.

Figure 11:
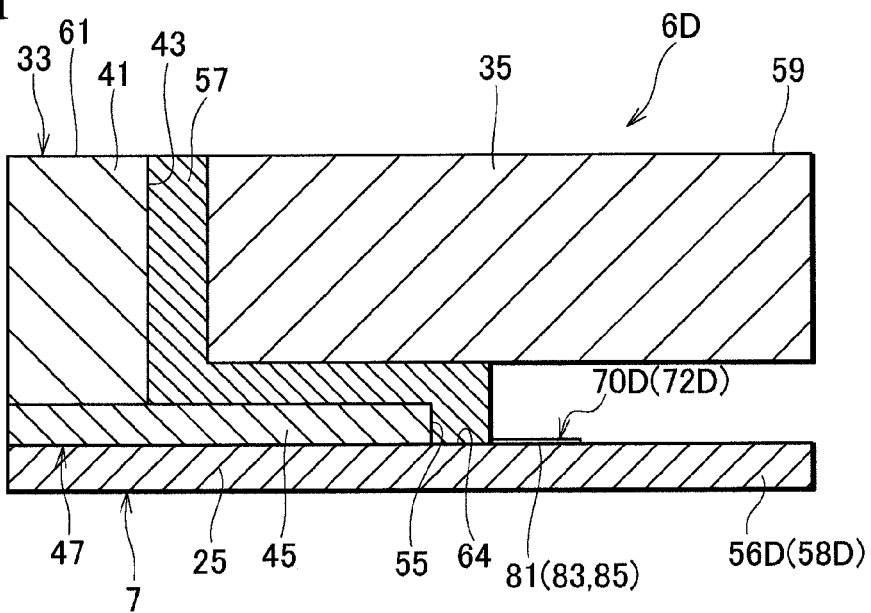
FIG. 11 is a sectional view partly illustrating a piezoelectric actuator to which a piezoelectric element fitting structure according to a fifth embodiment of the present invention is applied.

A fifth embodiment of the present invention will be explained with reference to FIG. 11. FIG. 11 is a sectional view partly illustrating a piezoelectric actuator to which a piezoelectric element fitting structure according to the fifth embodiment of the present invention is applied. The fifth embodiment is basically the same as the fourth embodiment, and therefore, corresponding parts are represented with the same reference marks, or the same reference marks plus "D" instead of "C" to omit a repetition of explanation.

Instead of the recesses 74, 76, and 78 of the stoppers 70 and 72 according to the first embodiment, the fifth embodiment forms water repellent parts 81, 83, and 85 for stoppers 70D and 72D on flexure protrusions 56D and 58D of a flexure 7.

The water repellent parts 81, 83, and 85 are formed by partly processing the flexure protrusions 56D and 58D with fluorine.

The water repellent parts 81, 83, and 85 of the stoppers 70D and 72D according to the fifth embodiment reduce the wettability of the flexure protrusions 56D and 58D, to provide effect similar to that provided by the fourth embodiment.

The water repellent part according to the fifth embodiment may be formed selectively on the stoppers. In this case, the remaining stopper may have any one of the recess, thorough hole, and laser-processed part of the first, third, and fourth embodiments.

Figure 12:
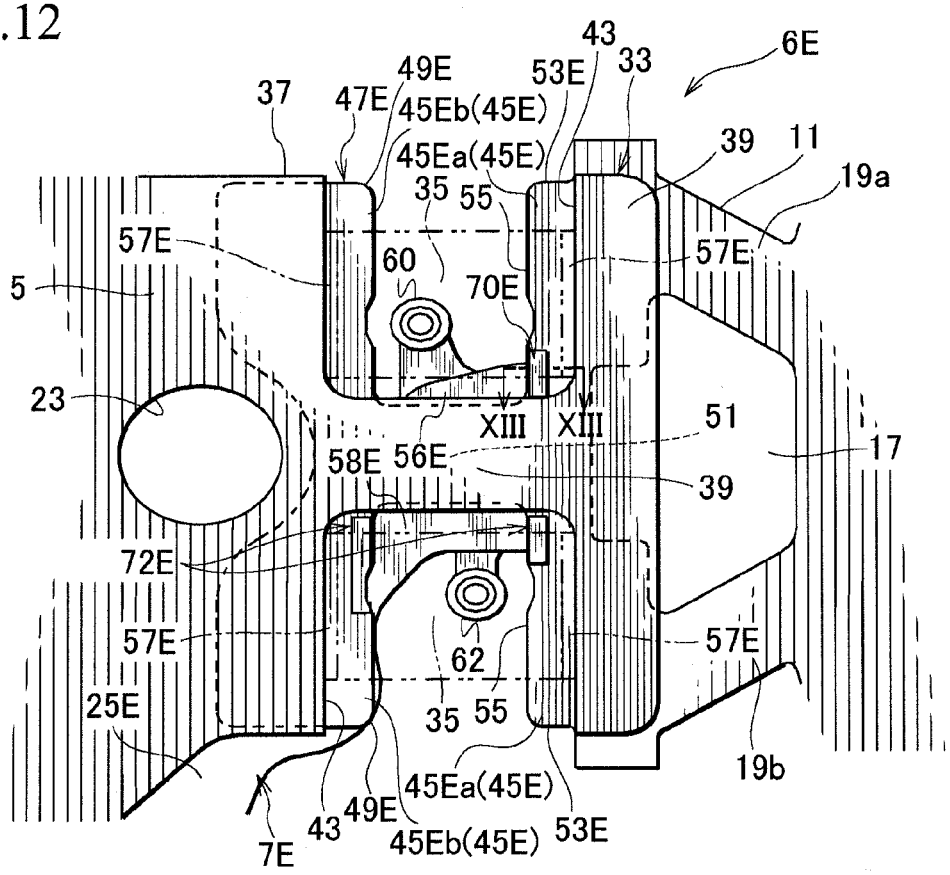
FIG. 12 is a partial plan view illustrating a piezoelectric actuator to which a piezoelectric element fitting structure according to a sixth embodiment of the present invention is applied.

A sixth embodiment of the present invention will be explained with reference to FIGS. 12 and 13. FIG. 12 is a partial plan view illustrating a piezoelectric actuator to which a piezoelectric element fitting structure according to the sixth embodiment of the present invention is applied and FIGS. 13A to 13D are sectional views taken along a line XIII-XIII of FIG. 12, illustrating various examples of the sixth embodiment. The sixth embodiment is basically the same as the first embodiment, and therefore, corresponding parts are represented with the same reference marks, or the same reference marks plus "E" to omit a repetition of explanation.

The sixth embodiment forms a stopper 70E (72E) on each receiver 45E in each opening 43E as illustrated in FIGS. 12 to 13D.

The stopper 70E (72E) is formed on an end part of the receiver 45E adjacent to a flexure protrusion 56E (58E) of a flexure 7E. The stopper 70E (72E) extends in a width direction of an actuator base 33 and protrudes widthwise from a part where the receiver 45E, the flexure protrusion 56E (58E), and an adhesive part 57E overlap one another.

The stopper 70E (72E) may be formed of a recess 74Ea (76Ea, 78Ea) as illustrated in FIG. 13A, or a through hole 89E (90E, 91E) as illustrated in FIG. 13B, or a laser-processed recess 74Eb (76Eb, 78Eb) as illustrated in FIG. 13C, or a water repellent part 81E (83E, 85E) as illustrated in FIG. 13D.

According to the sixth embodiment, the stopper 70E (72E) blocks on the receiver 45E a capillary phenomenon of liquid adhesive between a piezoelectric element 35 and the receiver 45E.

The sixth embodiment prevents a liquid adhesive from oozing from the receiver 45E to a hole 55 and contains the liquid adhesive within the periphery of the stopper 45E.

The sixth embodiment provides effect similar to that provided by the first embodiment.

The present invention is not limited to above-mentioned embodiments, and it is possible to modify the embodiments as long as the modifications accomplish the object of the present invention.

According to the embodiments mentioned above, the piezoelectric actuator 6 employs a pair of piezoelectric elements 35. The present invention is also applicable to a piezoelectric actuator employing a single piezoelectric element.

The stoppers of the embodiments are only examples. The position of the stopper is adjusted according to the shape of a flexure protrusion. The stopper is extended in a width direction with respect to a longitudinal direction of an area where the stopper, flexure protrusion, and adhesive part overlap one another.

What is claimed is:

1. A fitting structure fitting a piezoelectric element to an actuator base on which a wiring member is arranged to apply a voltage to the piezoelectric element, the piezoelectric element deforming according to the applied voltage and thereby displacing a supported object to the actuator base, the fitting structure comprising:
  an opening formed in the actuator base to accommodate the piezoelectric element;
  a receiver inwardly protruding from an inner circumferential edge of the opening to receive the piezoelectric element;
  a hole defined by an inner end of the receiver and communicating with the opening;
  a protrusion being a part of the wiring member and protruding from the inner end of the receiver onto the hole to face the piezoelectric element through the hole;
  an adhesive part formed of a liquid adhesive that is continuously filled in a space defined by the piezoelectric element, the inner circumferential edge of the opening, and the receiver and is solidified in the space to adhere the piezoelectric element to the inner circumferential edge of the opening and the receiver; and a stopper formed on one of the receiver and protrusion and stopping a capillary phenomenon of the liquid adhesive between the piezoelectric element and said one of the receiver and protrusion.

2. The fitting structure of claim 1, wherein the stopper is a recess formed by thinning the one of the receiver and protrusion.

3. The fitting structure of claim 2, wherein the recess has a bottom face being a flat face or an irregular face.

4. The fitting structure of claim 2, wherein the recess is formed in the protrusion adjacent to the receiver and a not-thinned remnant of the protrusion is present between the recess and the receiver.

5. The fitting structure of claim 1, wherein the stopper is a recess that reduces the wettability of one of the receiver and protrusion.

6. The fitting structure of claim 1, wherein the stopper is a through hole formed through the one of the receiver and protrusion.

7. The fitting structure of claim 1, wherein the stopper is a water repellent part formed by water repellent process carried out on the one of the receiver and protrusion.

8. A head suspension including the fitting structure according to claim 1, comprising:

a base and a load beam connected to the base;

a read/write head supported with the load beam; and a piezoelectric element fitted to the head suspension with the fitting structure at a location between the base and the load beam and deforming in response to a voltage applied thereto, thereby minutely moving the read/write head through the load beam in a sway direction.

* * * * *